(12) United States Patent
Truong et al.

(10) Patent No.: US 10,218,182 B2
(45) Date of Patent: Feb. 26, 2019

(54) PHOTOVOLTAIC SYSTEMS WITH VOLTAGE LIMITING DEVICES

(71) Applicant: SunPower Corporation, San Jose, CA (US)

(72) Inventors: Tuan Truong, San Jose, CA (US); Darren Hau, San Jose, CA (US); Andrew Ponec, San Jose, CA (US); Mark Albers, San Jose, CA (US); Benjamin Johnson, San Jose, CA (US)

(73) Assignee: SunPower Corporation, San Jose, CA (US)

(*) Notice: Subject to any disclaimer, the term of this patent is extended or adjusted under 35 U.S.C. 154(b) by 156 days.

(21) Appl. No.: 15/272,911

(22) Filed: Sep. 22, 2016

(65) Prior Publication Data

US 2018/0083450 A1 Mar. 22, 2018

(51) Int. Cl.
| | |
|---|---|
| *H02S 40/32* | (2014.01) |
| *H02J 3/38* | (2006.01) |
| *H02S 40/36* | (2014.01) |
| *H02J 3/46* | (2006.01) |
| *H01L 31/042* | (2014.01) |
| *H02S 50/00* | (2014.01) |
| *H02S 40/30* | (2014.01) |

(52) U.S. Cl.
CPC ............ *H02J 3/383* (2013.01); *H01L 31/042* (2013.01); *H02J 3/46* (2013.01); *H02S 40/30* (2014.12); *H02S 40/32* (2014.12); *H02S 40/36* (2014.12); *H02S 50/00* (2013.01)

(58) Field of Classification Search
CPC .... H02J 1/00; H02J 3/383; H02J 3/46; H02H 9/04; H02H 9/041; H02S 40/32; H02S 40/36; H02S 50/00; H02S 40/30; H01L 31/042
See application file for complete search history.

(56) References Cited

U.S. PATENT DOCUMENTS

| | | | |
|---|---|---|---|
| 9,472,691 B2 | 10/2016 | Kraft et al. | |
| 2013/0049710 A1 | 2/2013 | Kraft et al. | |
| 2015/0171628 A1* | 6/2015 | Ponec ...................... | H02J 1/00 307/77 |
| 2016/0118934 A1 | 4/2016 | Johnson et al. | |

* cited by examiner

*Primary Examiner* — Robert Deberadinis
(74) *Attorney, Agent, or Firm* — Okamoto & Benedicto LLP

(57) ABSTRACT

A photovoltaic system includes voltage limiting devices that are connected in series. A voltage limiting device clips a corresponding photovoltaic string to limit a voltage of the photovoltaic string. Unclipping of clipped photovoltaic strings is coordinated by a central controller or in a distributed fashion by the voltage limiting devices based on monitored string conditions.

19 Claims, 7 Drawing Sheets

PHOTOVOLTAIC SYSTEMS WITH VOLTAGE LIMITING DEVICES

STATEMENT REGARDING FEDERALLY SPONSORED RESEARCH OR DEVELOPMENT

The invention described herein was made with Governmental support under contract number DE-EE-0006882 awarded by the United States Department of Energy. The Government may have certain rights in the invention.

TECHNICAL FIELD

Embodiments of the subject matter described herein relate generally to photovoltaic systems.

BACKGROUND

A photovoltaic system comprises a plurality of solar cells and one or more photovoltaic inverters. The solar cells convert solar radiation to direct current, which is converted by a photovoltaic inverter to alternating current. A photovoltaic string comprises a set of solar cells that are electrically connected in series. Two or more photovoltaic strings may be further electrically connected in series for increased current output. For example, a photovoltaic module may comprise one or more series-connected photovoltaic strings that are packaged on the same frame. A photovoltaic module may be electrically connected in series and/or electrically connected in parallel with other photovoltaic modules.

The performance of a photovoltaic string may be degraded because of shading, presence of dirt, electrical malfunction, and other degradations. A degraded photovoltaic string may have reduced power output, which may adversely affect the power output of other photovoltaic strings that are electrically connected to the degraded photovoltaic string. Voltage clipping technology has been developed to limit the voltage of a photovoltaic string, thereby minimizing its impact to the rest of the photovoltaic system.

BRIEF SUMMARY

In one embodiment, a photovoltaic system includes voltage limiting devices that are connected in series. A voltage limiting device clips a corresponding photovoltaic string to limit a voltage of the photovoltaic string. Unclipping of clipped photovoltaic strings is coordinated by a central controller or in a distributed fashion by the voltage limiting devices based on monitored string conditions.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

In the present disclosure, numerous specific details are provided, such as examples of systems, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

A voltage limiting device may clip a photovoltaic string to limit a voltage of the photovoltaic string. Although voltage clipping may provide cost and efficiency benefits, voltage clipping may result in string collapse, which is a condition where significant unwanted reverse currents are sourced from unclipped photovoltaic strings and sunk into clipped photovoltaic strings.

Generally speaking, reverse currents are caused by a mismatch in voltages between components of the photovoltaic system that are placed in parallel. The reverse currents can have several negative impacts on the photovoltaic system. First, reverse current reduces the power available at the output of the array (e.g., to the photovoltaic inverter). Second, reverse current causes additional heating of solar cells and other system components. Third, reverse currents may be problematic for maintenance personnel, where the presence of reverse currents may require a change in operating procedures, confusion, or present a safety risk. Fourth, reverse currents of sufficient magnitude can cause over current protection devices, such as fuses and circuit breakers, to activate, leading to power loss and maintenance issues.

String collapse in photovoltaic systems where voltage limiting devices are connected in series can be particularly troublesome due to a positive feedback loop that results from clipping activation. On many photovoltaic systems, multiple series-connected photovoltaic strings (e.g., series-connected photovoltaic modules) are placed in parallel on a common bus. The voltage of the bus may be relatively unperturbed by the state of a single photovoltaic string, either due to the photovoltaic inverter's control of the bus voltage and/or the large number of photovoltaic strings connected in parallel. If the bus voltage is held roughly constant, when one of the series-connected voltage limiting devices activates (i.e., clips a corresponding photovoltaic string), the voltage on neighboring series-connected voltage limiting devices will increase because the same bus voltage is now divided unequally between voltage limiting devices in the series. The increased voltage on the neighboring voltage limiting devices may cause one or more of them to limit their voltage, and so on, resulting in cascaded activation of voltage limiting devices until the total voltage reduction is much more than was originally necessary to protect the system from overvoltage.

Figure 1:
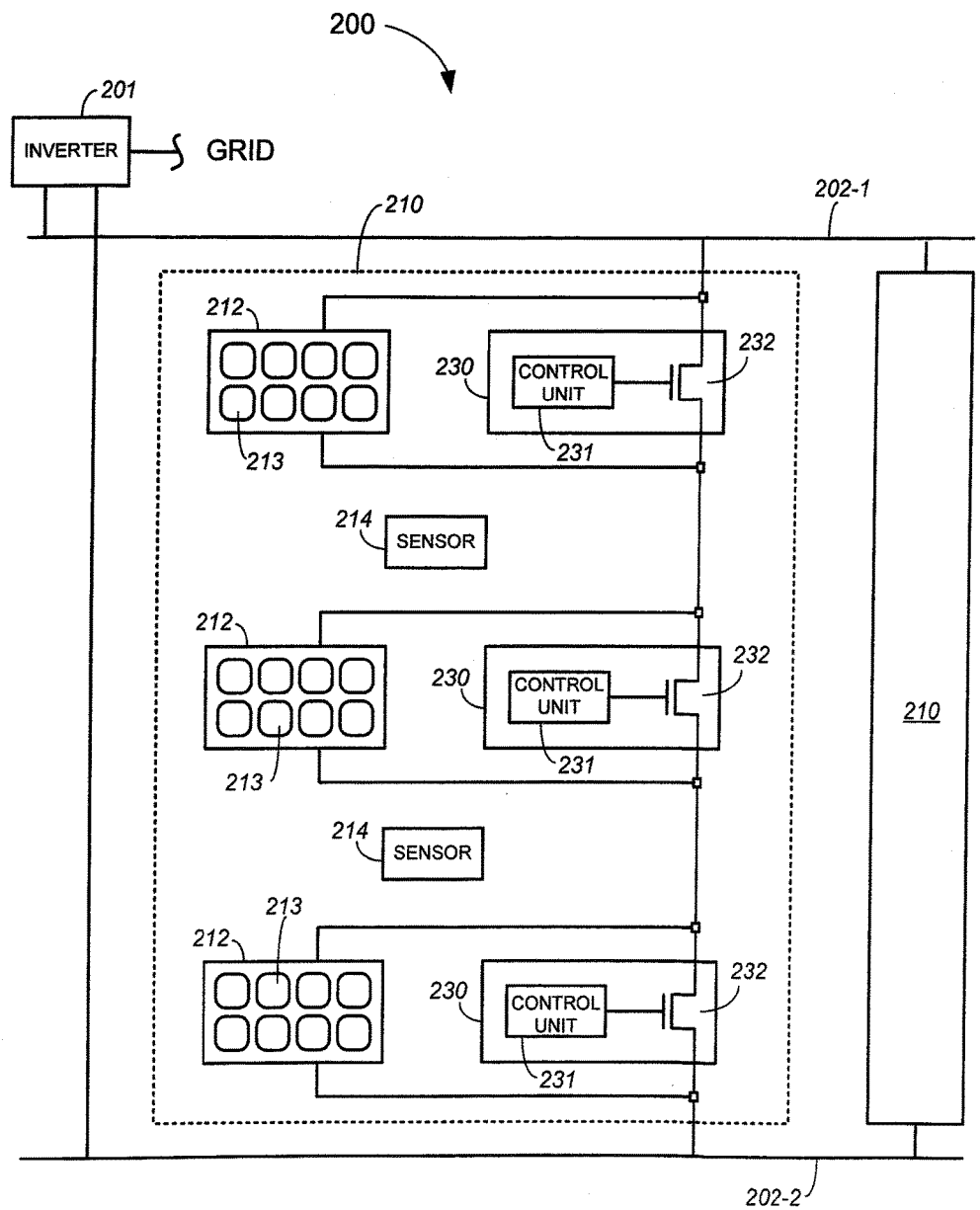
FIG. 1 shows a logical diagram of a photovoltaic system in accordance with an embodiment of the present invention.

Referring now to FIG. 1, there is shown a logical diagram of a photovoltaic system 200 in accordance with an embodiment of the present invention. In the example of FIG. 1, the photovoltaic system 200 comprises one or more photovoltaic inverters 201 and one or more groups 210 of photovoltaic strings. In one embodiment, the groups 210 of photovoltaic strings are electrically connected in parallel across a power bus 202 (i.e., 202-1 and 202-2). A photovoltaic inverter 201 receives from the bus 202 direct current generated by solar cells 213, and converts the direct current to alternating current that is provided to a utility power grid.

In one embodiment, a group 210 of photovoltaic strings comprises one or more photovoltaic strings 212 that are electrically connected in series. A photovoltaic string 212 may comprise a plurality of series-connected solar cells 213. A group 210 photovoltaic strings may be a photovoltaic module, for example. More particularly, the photovoltaic system 200 may comprise photovoltaic modules that are in parallel across the bus 202. As can be appreciated, a group 210 of photovoltaic strings may also comprise photovoltaic modules that are connected in series.

The photovoltaic system 200 may include one or more sensors 214 for detecting weather conditions (e.g., wind, humidity), solar illumination, temperature, etc. The sensors 214 may be located on photovoltaic modules, adjacent the solar cells 213, and other locations where measurement data are to be acquired.

In the example of FIG. 1, a voltage across opposing ends of a photovoltaic string 212 may be limited by a voltage limiting device 230. The voltage limiting device 230 may clip the photovoltaic string to limit the voltage of the photovoltaic string 212 by controlling a switch 232. Closing the switch 232 creates a short that bypasses the photovoltaic string, thereby reducing the string voltage to substantially zero. The switch 232 may also vary the degree of closure of the switch 232 to limit the voltage of the photovoltaic string to a relatively lower value other than zero. The switch 232 may comprise a semiconductor transistor or other voltage limiting component.

The voltage limiting device 230 may include a control unit 231 for clipping a photovoltaic string 212 when measured electrical parameters of the photovoltaic string 212 indicate a safety issue, performance degradation, or other undesirable condition where limiting the voltage of the photovoltaic string 212 is desirable. The control unit 231 may be configured to place the photovoltaic string 212 from a clipped state back to an unclipped state (i.e., without voltage limiting) when measured electrical parameters of the photovoltaic string 212 indicate that an undesirable condition no longer exists as commanded by a central controller (e.g., FIG. 3, 301), based on detected action of other voltage limiting devices 230, or by coordinating with other voltage limiting devices 230, to name some example unclipping conditions. The control unit 231 may open the switch 232 to unclip the photovoltaic string 212.

Figure 2:
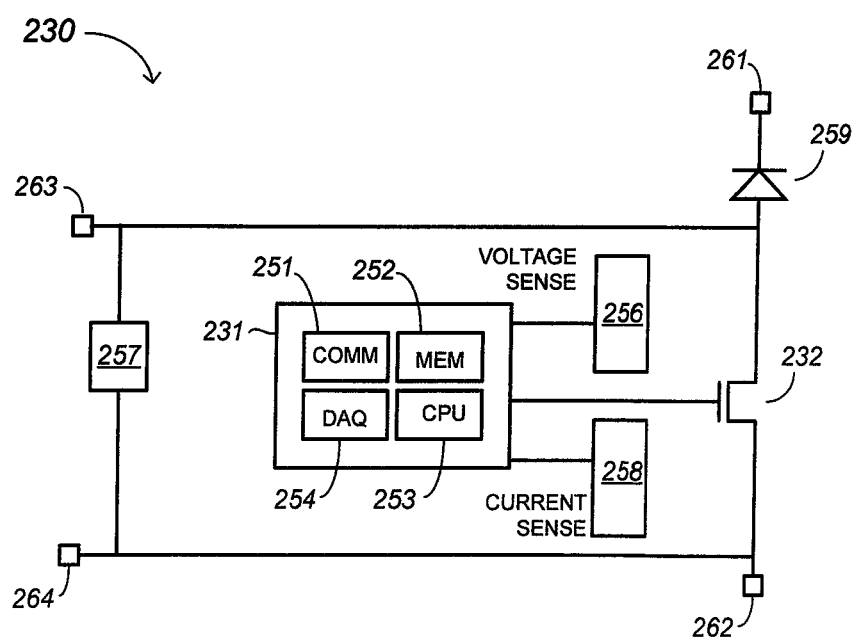
FIG. 2 shows a logical diagram of a voltage limiting device in accordance with an embodiment of the present invention

FIG. 2 shows a logical diagram of a voltage limiting device 230 in accordance with an embodiment of the present invention. In one embodiment, the voltage limiting device 230 comprises the control unit 231, the switch 232, a bypass diode 257, a reverse current diode 259, voltage sensors 256, and current sensors 258. As can be appreciated, one or more components of the voltage limiting device 230 (e.g., the switch 232, bypass diode 257, reverse current diode 259) may be placed external of the housing or board of the voltage limiting device 230. In the example of FIG. 2, the components of the voltage limiting device 230 are mounted on the same printed circuit board, with terminal nodes 261-264. The nodes 263 and 264 may be connected to opposing end electrodes of the photovoltaic string 212. The nodes 261 and 262 allow the voltage limiting device 230 to be series-connected with other voltage limiting devices 230.

In the example of FIG. 2, the control unit 231 comprises a communications interface 251, data acquisition and control circuits 254, a memory 252, and a central processing unit 253. The control unit 231 may be a single-chip microcontroller unit (MCU), a single-board computer, or a custom integrated circuit, for example. The voltage limiting device 230 may comprise one or more voltage sensors 256 (e.g., voltage divider network) for detecting the voltage of the photovoltaic string 212 (e.g., across the nodes 263 and 264) and one or more current sensors 258 (e.g., series sense resistor, hall effect sensor). A current sensor 258 may be configured to measure current through the photovoltaic string 212, the voltage limiting device 230 (i.e., the current through the diode 259), and/or the connections for nodes 261 or 262 (if present). The data acquisition and control circuits 254 may receive analog voltage and current readings, and convert the readings to digital form suitable for transmission by the communications interface 251 over a wired or wireless connection, or for processing by firmware stored in the memory 252 and executed by the CPU 253. The operation of the voltage limiting device 230 may be configurable by downloading appropriate firmware to the memory 252.

Figure 3:
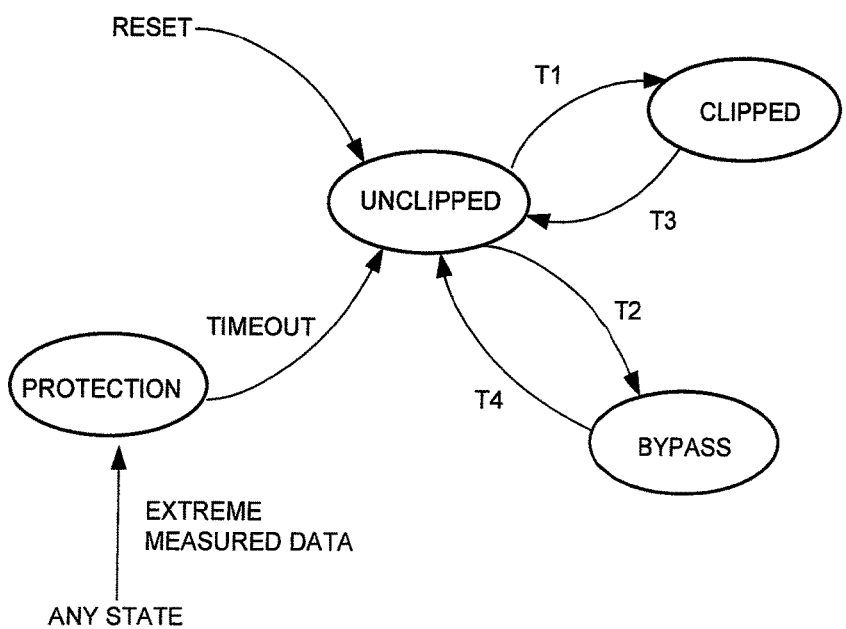
FIG. 3 shows a state machine for voltage limiting a photovoltaic string in accordance with an embodiment of the present invention.

FIG. 3 shows a state machine for voltage limiting a photovoltaic string 212 in accordance with an embodiment of the present invention. The state machine of FIG. 3 may be followed by the voltage limiting device 230, as programmed with the firmware in the memory 252. In the example of FIG. 3, a photovoltaic string 212 may be in a protection, unclipped, clipped, or bypass state.

In one embodiment, the photovoltaic string 212 is in an unclipped state upon power up or reset of the voltage limiting device 230. The transitions T1 and T3 may occur based on measured voltage and current of the photovoltaic string 212. More particularly, the control unit 231 may receive a measured voltage of the photovoltaic string 212 and a measured current of the photovoltaic string 212, and trigger a transition T1 or a transition T3 depending on the measurements. In one embodiment, the photovoltaic string 212 transitions from an unclipped state to a clipped state when the measured voltage or current is above a programmed limit (transition T1), and transitions from the clipped state to the unclipped state when the measured voltage and current are below programmed limits (transition T3).

The transitions T1 and T3 may be modified based on an external command. For example, the voltage limiting device 230 may receive a command from a central controller and decrease a programmed limit in response to the command. In embodiments that employ a model, the transitions T1 and T3 may be modified based on the model. For example, the transition T3 may be taken when the model indicates that the photovoltaic string 212 is operating near its maximum power point. As another example, the transition T1 or T3 may be taken based on string current predicted by the model, instead of measured string current.

In the example of FIG. 3, the transition T2 occurs when measurements indicate that a particular bypass diode has turned ON, and the transition T4 occurs when measurements indicate that a particular bypass diode has turned OFF. In one embodiment, the transitions T2 and T4 are applicable to a voltage limiting device 230 with a single monitored bypass diode 257. The transitions T2 and T4 and the bypass state are optional. The voltage limiting device 230 may omit the transitions T2 and T4 and the bypass state and take no special action on bypass diode operation.

From any state, the photovoltaic string 212 transitions to the protection state when extreme measured values (e.g., string voltage and/or current above a safety threshold) are detected. In one embodiment, the protection state places the switch 232 (e.g., a transistor) in a state that is safe under the detected extreme conditions. For example, if the voltage across the switch 232 exceeds a threshold, the switch 232 may be turned ON to close the switch 232 and reduce the voltage to substantially zero, preventing damage to the switch 232. This differs from normal clipping behavior where other criteria may be required to trigger clipping (e.g., FIG. 3, transition T1), but the extreme voltage causes the switch 232 to be turned ON anyway. This extreme voltage may be higher (or more negative) than what is experienced during normal operation, even when clipping is required. The extreme voltage may be due to the failure of another component or connection, such as if the diode 257 fails and becomes an open circuit or if the diode 259 is omitted and connection 264 increases in resistance. If the temperature of the switch 232 gets very high as detected by a temperature sensor, then the switch 232 may be turned OFF until the temperature reaches a lower, acceptable level. In any of these examples, the normal clipping/unclipping behavior is prohibited by the voltage limiting device 230 by staying in the protection state until the extreme condition has ceased. Entry to the protection state may be recorded in the memory 252 (e.g., non-volatile memory) or communicated by way of the communications interface 251. From the protection state, the photovoltaic string 212 transitions to the unclipped state after a timeout period when an extreme measured value no longer exists.

The voltage limiting device 230 may incorporate local or stand-alone features to protect the photovoltaic string 212 from reverse currents. In the example of FIG. 2, the voltage limiting device 230 includes the diode 259 to block reverse currents. Another way to protect against reverse currents is to configure the voltage limiting device 230 to measure current through the photovoltaic string 212, and to unclip a clipped photovoltaic string 212 when the measured current is negative or lower than a threshold, thereby preventing the reverse current from further increasing. As will be more apparent below, the voltage limiting device 230 may also operate in conjunction with a central controller and/or with other voltage limiting devices 230 to prevent reverse currents that are caused by voltage limiting activity.

Figure 4:
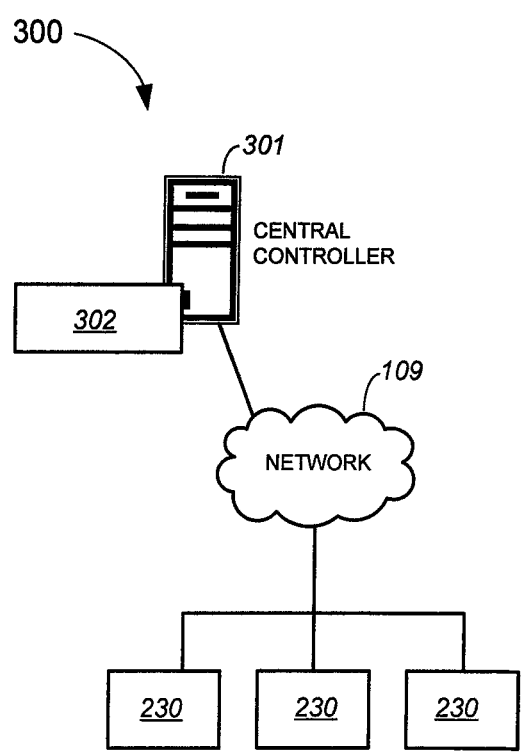
FIG. 4 shows a system for controlling voltage limiting devices in accordance with an embodiment of the present invention.

FIG. 4 shows a system 300 for controlling voltage limiting devices 230 in accordance with an embodiment of the present invention. In the example of FIG. 3, the system 300 comprises a central controller 301 and one or more voltage limiting devices 230. In the example of FIG. 4, the voltage limiting devices 230 and the central controller 301 may communicate over a communications network 109. The network 109 may comprise a data over power lines connection (e.g., Power Line Communication), a wireless connection (e.g., WiFi, ZigBee wireless), wired connection (e.g., Ethernet, data-only connection), etc.

The central controller 301 may comprise a general-purpose computer (e.g., desktop or server computer), a plant controller, or other computing device. In the example of FIG. 4, the central controller 301 includes a management module 302 for controlling operation of voltage limiting devices 230. The management module 302 may comprise instructions stored in the memory of the central controller 301 for execution by the processor of the central controller 301.

In one embodiment, the management module 302 is configured to implement a model for predicting an IV curve of a group 210 of photovoltaic strings 212 and for predicting the string current of the group 210, i.e., the current through the series-connected photovoltaic strings 212. For example, in embodiments where the group 210 is a photovoltaic module with a plurality of series-connected photovoltaic strings 212, the model may predict the string current of the photovoltaic module based on predicted IV curve, measurements, known specifications, and other data.

Figure 5:
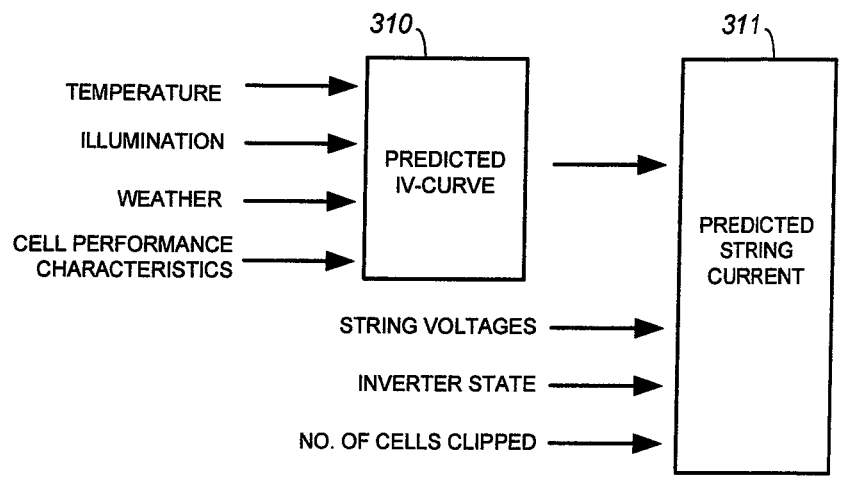
FIG. 5 shows a flow diagram of a model for predicting string current in accordance with an embodiment of the present invention.

FIG. 5 shows a flow diagram of a model for predicting string current in accordance with an embodiment of the present invention. As can be appreciated, the string current is the current through series-connected photovoltaic strings 212, and is the same for all solar cells 213 and voltage limiting devices 230 in the series. In the example of FIG. 5, the model generates a predicted IV-curve (see 310) of the photovoltaic string 212 from received data on temperature of the photovoltaic strings 212, sun illumination on the solar cells 213 of the photovoltaic strings 212, weather, and performance characteristics of the solar cells 213. The temperature and illumination data of the photovoltaic string 212 may be sensor readings taken from the solar cells 213 or the photovoltaic module that includes the solar cells 213. Weather data may be received from wind vanes, humidity sensors, etc. in the vicinity of the photovoltaic strings 212. The cell performance characteristics may be obtained from solar cell specifications and other solar cell data available from the manufacturer of the solar cells. IV-curve data provided by the manufacturer may also be modified based on measured temperature, illumination, and weather data to generate the predicted IV-curve. The current through the photovoltaic string 212 may then be predicted (see 311) based on the predicted IV-curve, the voltage of the photovoltaic string 212, the state of the photovoltaic inverter, the number of photovoltaic strings 212 that are clipped, and other data.

Figure 6:
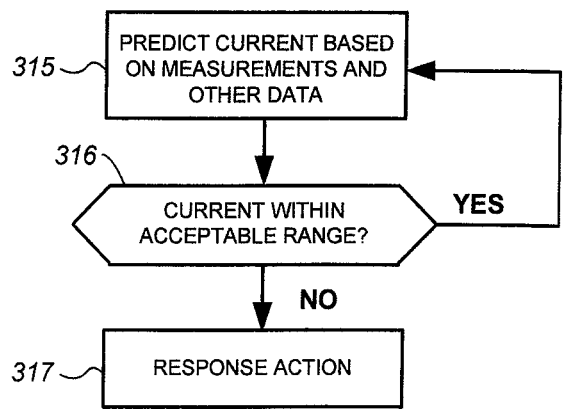
FIG. 6 shows a flow diagram of a method of operating a photovoltaic system based on predicted string current in accordance with an embodiment of the present invention.

FIG. 6 shows a flow diagram of a method of operating a photovoltaic system based on predicted string current in accordance with an embodiment of the present invention. In the example of FIG. 6, the current through a photovoltaic string 212 (i.e., string current) is predicted based on measurements and other data (step 315). The current through the photovoltaic string 212 may be predicted using a model, as in the example of FIG. 5. The predicted string current is compared to thresholds to determine if the predicted string current is within an acceptable range (step 316). If the predicted string current is within the acceptable range, the string current is predicted based on newest measurements and other data (step 316 to step 315). Otherwise, if the predicted string current is not within the acceptable range, a response action is performed in an attempt to change the predicted string current (step 316 to step 317). The response action may be to change a photovoltaic inverter setpoint.

Another response action may be to change the state of a photovoltaic string 212 that is limited by a voltage limiting device 230. For example, the central controller 301 may receive measurements from sensor 214 and voltage limiting devices 230, predict the string current through the photovoltaic strings 212, and command a voltage limiting device 230 to unclip a clipped photovoltaic string 212 when the model predicts that the string current is or will become reverse current.

An important aspect of using voltage limiting devices 230 in photovoltaic systems is determining when to end a voltage limiting operation, i.e., when to unclip a photovoltaic string 212 that is in a clipped state. If the voltage limiting device 230 unclips at the wrong time, the photovoltaic system may reach a voltage that exceeds regulatory requirements and/or damages system equipment. Failing to unclip when the photovoltaic string 212 no longer needs clipping can lead to power loss or system damage. It is therefore important that clipped photovoltaic strings 212 are quickly unclipped when it is safe to do so as soon as possible. Changing the state of a photovoltaic string 212 from clipped to unclipped is also referred to herein as string restoration.

It is advantageous in some applications for a voltage limiting device 230 to operate under local control only, i.e., to not rely on any outside communication to determine the proper clip state. Eliminating the need for external communications may be done to reduce cost, complexity, or for other reasons. However, multiple series-connected voltage limiting devices 230 can have interactions that prevent a voltage limiting device 230 from unclipping.

For example, consider two series-connected voltage limiting devices 230 that are connected to photovoltaic strings 212 that have equal number of series-connected solar cells 213. If both voltage limiting devices 230 are clipping their respective photovoltaic strings 212 and the voltage limiting devices 230 are connected to a bus with a steady voltage, the voltage limiting devices 230 will share the bus voltage equally. However, if one of the voltage limiting devices 230 unclips (e.g., because system conditions indicate that clipping is no longer necessary), the constant bus voltage will suddenly be shared unequally between the two voltage limiting devices 230. If the unequally shared voltage of the voltage limiting device 230 that unclipped exceeds the voltage limit it is programmed for, the voltage limiting device 230 will re-clip in order to prevent damage to the system. Either voltage limiting device 230 may cycle through determining that it is safe to unclip, unclipping, and re-clipping due to overvoltage. This problematic unclipping and re-clipping cycle, whereby unclipping generates local voltages exceeding a clipping threshold, may occur in photovoltaic systems where multiple voltage limiting devices 230 with local only voltage-based control are connected in series.

To prevent unclipping and re-clipping cycles during restoration of photovoltaic strings 212, embodiments of the present invention allow series-connected voltage limiting devices 230 to be synchronized to unclip at roughly the same time. By doing so, any bus voltage across the voltage limiting devices 230 will once again be shared equally upon re-clipping, allowing the voltage limiting devices 230 to unclip without triggering themselves to re-clip.

Figure 7:
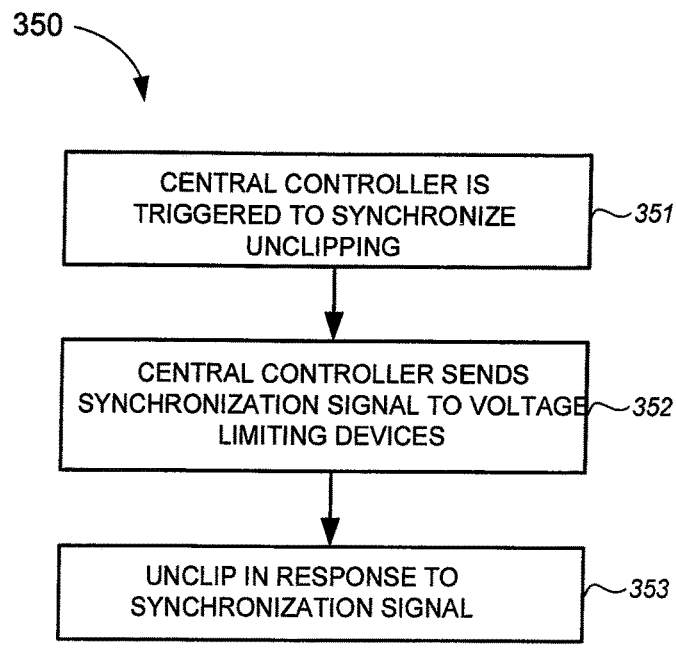
FIGS. 7-9 show flow diagrams of methods of synchronizing operation of voltage limiting devices in accordance with embodiments of the present invention.

FIG. 7 shows a flow diagram of a method 350 of synchronizing operation of voltage limiting devices 230 in accordance with an embodiment of the present invention. In the example of FIG. 7, a central controller 301 (see FIG. 4) is triggered to synchronize unclipping of series-connected voltage limiting devices 230 (step 351). In response to the trigger, the central controller 301 sends a synchronization signal to the voltage limiting devices 230 (step 352). Clipped voltage limiting devices 230 in the string unclip in response to receiving the synchronization signal (step 353).

Various conditions may trigger the central controller 301 to synchronize unclipping. For example, the central controller 301 may be configured to synchronize unclipping of voltage limiting devices 230 simply based on time. More particularly, the central controller may periodically (e.g., every x minutes) send a synchronization signal to the voltage limiting devices 230.

The central controller 301 may trigger to synchronize unclipping when the central controller 301 detects that a certain number of voltage limiting devices 230 are clipped or a certain number of voltage limiting devices 230 have been clipped for a certain period of time.

The central controller 301 may trigger to synchronize unclipping based on a current threshold. For example, the central controller 301 may synchronize unclipping if the current from a string has been very low for a certain period of time.

The central controller 301 may trigger to synchronize unclipping based on relative string performance. For example, if the performance of a photovoltaic string 212 is below 50% (or some other percentage) of the performance of other photovoltaic strings 212 in the photovoltaic system, the central controller 301 may send a synchronization signal to address a possible over clipping.

The central controller 301 may also trigger to synchronize unclipping based on weather or other external information. For example, the central controller 301 may send the synchronization signal when the photovoltaic system is generating less power than expected based on current weather conditions.

The central controller 301 may also trigger to synchronize unclipping based on a state of the photovoltaic inverter. Some operational regimes, such as when voltages are low, cause more mismatch between photovoltaic modules/strings, thereby exacerbating reverse currents and string restoration issues. The central controller 301 may send a synchronization signal to attempt unclipping when the photovoltaic inverter is operating in one of these regimes. Similarly, time of day and temperature have an impact on the prevalence of reverse currents and string restoration. The central controller 301 may be configured to send synchronization signals more often at some times of day or during certain temperatures than others.

The central controller 301 may send the synchronization signal for unclipping over a variety of signal paths, such as over a wired connection, wireless connection, data over power lines (e.g., Power Line Communication), etc. For example, the synchronization signal may be a modulated voltage that is transmitted by power line communication. The voltage limiting devices 230 may be configured to synchronize to the modulating voltage, and unclip in response thereto. The synchronization signal may also be a shared signal, such as voltage ripple from a load, that the voltage limiting devices 230 are subject to.

Figure 8:
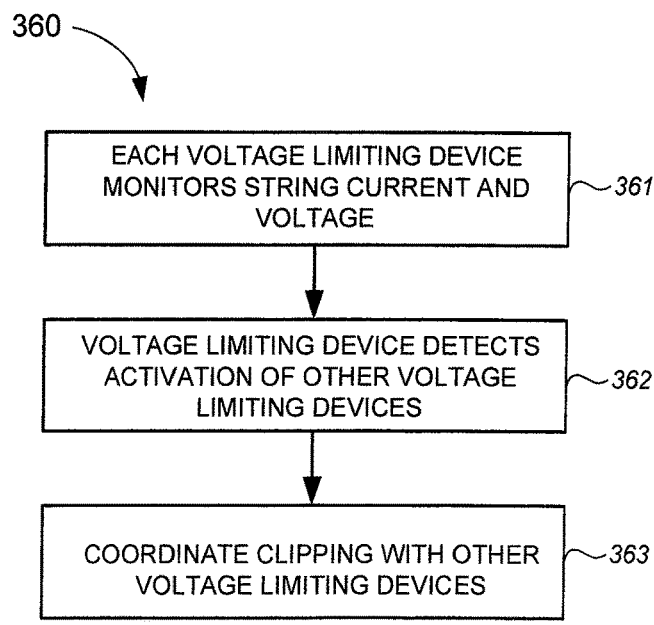

FIG. 8 shows a flow diagram of a method 360 of synchronizing operation of voltage limiting devices 230 in accordance with an embodiment of the present invention. In the example of FIG. 8, synchronization is achieved in a distributed fashion, with each voltage limiting device 230 monitoring changes in current and voltage of the photovoltaic strings they are configured to limit (step 361). For example, consider that each time a voltage limiting device 230 in a series of voltage limiting devices 230 clips, the current and voltage across the photovoltaic strings 212 monitored by the voltage limiting devices 230 will suddenly jump (e.g., string current may go down and voltage may go up). That is, a voltage limiting device 230 may detect clipping and unclipping of other voltage limiting devices by monitoring string current and voltage (step 362). To prevent unwanted clipping-unclipping cycles, a voltage limiting device 230 may be configured to synchronize its own unclipping times to those of other voltage limiting devices 230 that are detected as unclipping on the same string (step 363).

Figure 9:
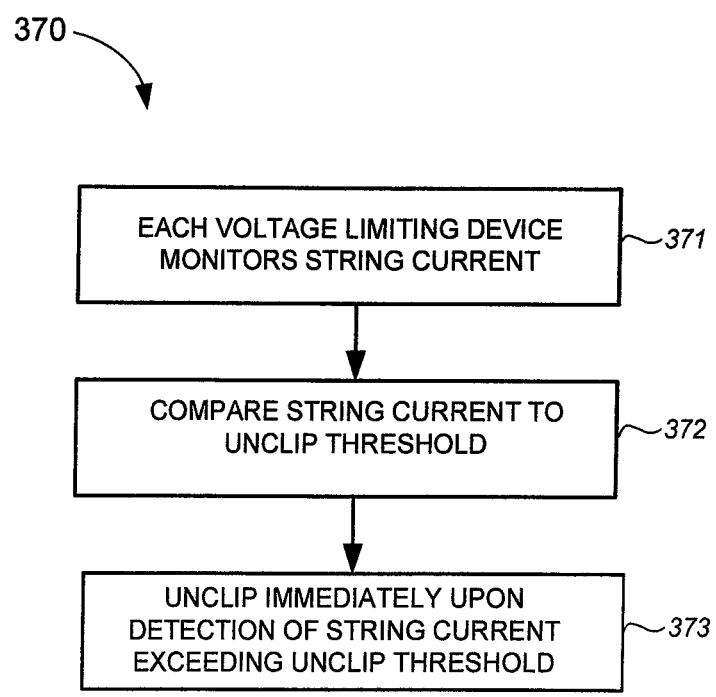

FIG. 9 shows a flow diagram of a method 370 of synchronizing operation of voltage limiting devices 230 in accordance with an embodiment of the present invention. In the example of FIG. 9, each voltage limiting device 230 on the string monitors the string current (step 371), compares the string current to an unclipping threshold (step 372), and unclips immediately upon detection of string current that exceeds the unclipping threshold (step 373). The unclipping threshold may be a negative threshold indicative of reverse current. Because the string current is the same across the voltage limiting devices 230 in the series, multiple voltage limiting devices 230 have a chance to unclip simultaneously, thereby resulting in an even voltage distribution that can help prevent unclipping/re-clipping cycles during string restoration.

Photovoltaic systems with voltage limiting devices have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A photovoltaic system comprising:
a plurality of voltage limiting devices that are connected in series;
a plurality of photovoltaic strings, each of the photovoltaic strings comprising series-connected solar cells, wherein a voltage of each of the photovoltaic strings is configured to be clipped or unclipped by a corresponding voltage limiting device; and
a central controller configured to send a synchronization signal to synchronize unclipping of voltages of photovoltaic strings that are clipped by corresponding clipped voltage limiting devices,
wherein the clipped voltage limiting devices are configured to unclip at substantially the same time in synchronization with the synchronization signal.

2. The photovoltaic system of claim 1, wherein the synchronization signal is transmitted over a power line communication connection.

3. The photovoltaic system of claim 1, wherein the synchronization signal is transmitted over a wireless connection.

4. The photovoltaic system of claim 1, wherein the synchronization signal is transmitted over a wired connection.

5. The photovoltaic system of claim 1, further comprising:
a photovoltaic inverter that is configured to convert direct current generated by solar cells of the plurality of photovoltaic strings to alternating current for delivery to a power grid.

6. The photovoltaic system of claim 1, wherein the plurality of photovoltaic strings forms a first group of photovoltaic strings that are connected in series, and the first group of photovoltaic strings is in parallel with a second group of photovoltaic strings that are connected in series.

7. The photovoltaic system of claim 6, further comprising:
a voltage bus,
wherein the first group of photovoltaic strings and the second group of photovoltaic strings are connected in parallel across the voltage bus.

8. The photovoltaic system of claim 1, wherein each of the voltage limiting devices comprises a switch that is closed by the voltage limiting device when clipping a corresponding photovoltaic string.

9. A method of operating voltage limiting devices of a photovoltaic system, the method comprising:
clipping, by a first voltage limiting device, a voltage of a first photovoltaic string that comprises a first set of series-connected solar cells;
clipping, by a second voltage limiting device, a voltage of a second photovoltaic string that comprises a second set of series-connected solar cells;
sending a synchronization signal to a plurality of voltage limiting devices that include the first and second voltage limiting devices and that are connected in series; and
responsive to receiving the synchronization signal, the first voltage limiting device unclipping the voltage of the first photovoltaic string and the second voltage limiting device unclipping the voltage of the second photovoltaic string at substantially the same time.

10. The method of claim of claim 9, wherein the synchronization signal is sent by a central controller to the plurality of voltage limiting devices.

11. The method of claim 10, wherein the first and second voltage limiting devices receive the synchronization signal over a wireless connection.

12. The method of claim 10, wherein the first and second voltage limiting devices receive the synchronization signal over a power line communication connection.

13. The method of claim 10, wherein the first and second voltage limiting devices receive the synchronization signal over a wired connection.

14. A photovoltaic system comprising:
a first voltage limiting device that is configured to clip a voltage of a first photovoltaic string, the first voltage limiting device being configured to clip the voltage of the first photovoltaic string, and to monitor a string current through the first photovoltaic string and a second photovoltaic string ; and
a second voltage limiting device that is in series with the first voltage limiting device, the second voltage limiting device being configured to clip a voltage of the second photovoltaic string, and to monitor the string current through the first photovoltaic string and the second photovoltaic string,
wherein, responsive to detecting that the string current through the first photovoltaic string and the second photovoltaic string is reversing, the first voltage limiting device is configured to unclip the voltage of the first photovoltaic string and the second voltage limiting device is configured to unclip the voltage of the second photovoltaic string.

15. The photovoltaic system of claim 14, wherein the first and second voltage limiting devices form a first group of series-connected voltage limiting devices that is across a voltage bus.

16. The photovoltaic system of claim 15, further comprising a second group of series-connected voltage limiting devices that is across the voltage bus and in parallel with the first group of series-connected voltage limiting devices.

17. The photovoltaic system of claim 14, further comprising a photovoltaic inverter that converts direct current generated by solar cells of the first and second photovoltaic strings to alternating current.

18. The photovoltaic system of claim 14, wherein the second voltage limiting device comprises:

a switch that is across opposing ends of the second photovoltaic string; and a control unit that is configured to control the switch.

19. The photovoltaic system of claim 18, wherein to unclip the second photovoltaic string, the control unit opens the switch to release a limit on the voltage of the second photovoltaic string.

* * * * *